United States Patent
Okamoto et al.

(10) Patent No.: US 11,626,386 B2
(45) Date of Patent: Apr. 11, 2023

(54) SEMICONDUCTOR INTEGRATED CIRCUIT DEVICE AND SEMICONDUCTOR PACKAGE STRUCTURE

(71) Applicant: SOCIONEXT INC., Kanagawa (JP)

(72) Inventors: Atsushi Okamoto, Yokohama (JP); Hirotaka Takeno, Yokohama (JP); Wenzhen Wang, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 167 days.

(21) Appl. No.: 17/206,257

(22) Filed: Mar. 19, 2021

(65) Prior Publication Data

US 2021/0210466 A1 Jul. 8, 2021

Related U.S. Application Data

(63) Continuation of application No. PCT/JP2019/036598, filed on Sep. 18, 2019.

(30) Foreign Application Priority Data

Sep. 28, 2018 (JP) .............................. JP2018-183553

(51) Int. Cl.
*H01L 23/50* (2006.01)
*H01L 25/065* (2023.01)
*H01L 23/538* (2006.01)
*H01L 27/088* (2006.01)

(52) U.S. Cl.
CPC .......... *H01L 25/0657* (2013.01); *H01L 23/50* (2013.01); *H01L 23/5384* (2013.01); *H01L 27/088* (2013.01)

(58) Field of Classification Search
CPC .. H01L 25/0657; H01L 23/50; H01L 23/5384
See application file for complete search history.

(56) References Cited

U.S. PATENT DOCUMENTS

| | | | |
|---|---|---|---|
| 8,035,194 | B2 | 10/2011 | Lee et al. |
| 2011/0084365 | A1 | 4/2011 | Law et al. |
| 2014/0151882 | A1 | 6/2014 | Morimoto |
| 2016/0148907 | A1* | 5/2016 | Segawa ................ H01L 27/092 257/369 |

(Continued)

FOREIGN PATENT DOCUMENTS

| | | |
|---|---|---|
| JP | 2011-082524 A | 4/2011 |
| JP | 2012-178425 A | 9/2012 |
| WO | 2013/168354 A1 | 11/2013 |

OTHER PUBLICATIONS

International Search Report issued in corresponding International Patent Application No. PCT/JP2019/036598, dated Dec. 3, 2019, with partial English translation.

*Primary Examiner* — Trang Q Tran
(74) *Attorney, Agent, or Firm* — McDermott Will & Emery LLP

(57) ABSTRACT

A semiconductor integrated circuit device includes first and second semiconductor chips stacked one on top of the other. First power supply lines in the first semiconductor chip are connected with second power supply lines in the second semiconductor chip through a plurality of first vias. The directions in which the first power supply lines and the second power supply lines extend are orthogonal to each other.

5 Claims, 15 Drawing Sheets

(56) References Cited

U.S. PATENT DOCUMENTS

| | | | |
|---|---|---|---|
| 2016/0203758 A1* | 7/2016 | Tsuge | G09G 3/325 |
| | | | 345/76 |
| 2017/0062421 A1 | 3/2017 | Cosemans et al. | |
| 2018/0145030 A1 | 5/2018 | Beyne et al. | |
| 2019/0252353 A1 | 8/2019 | Lattard et al. | |
| 2019/0393205 A1* | 12/2019 | Lee | G06F 30/394 |

* cited by examiner

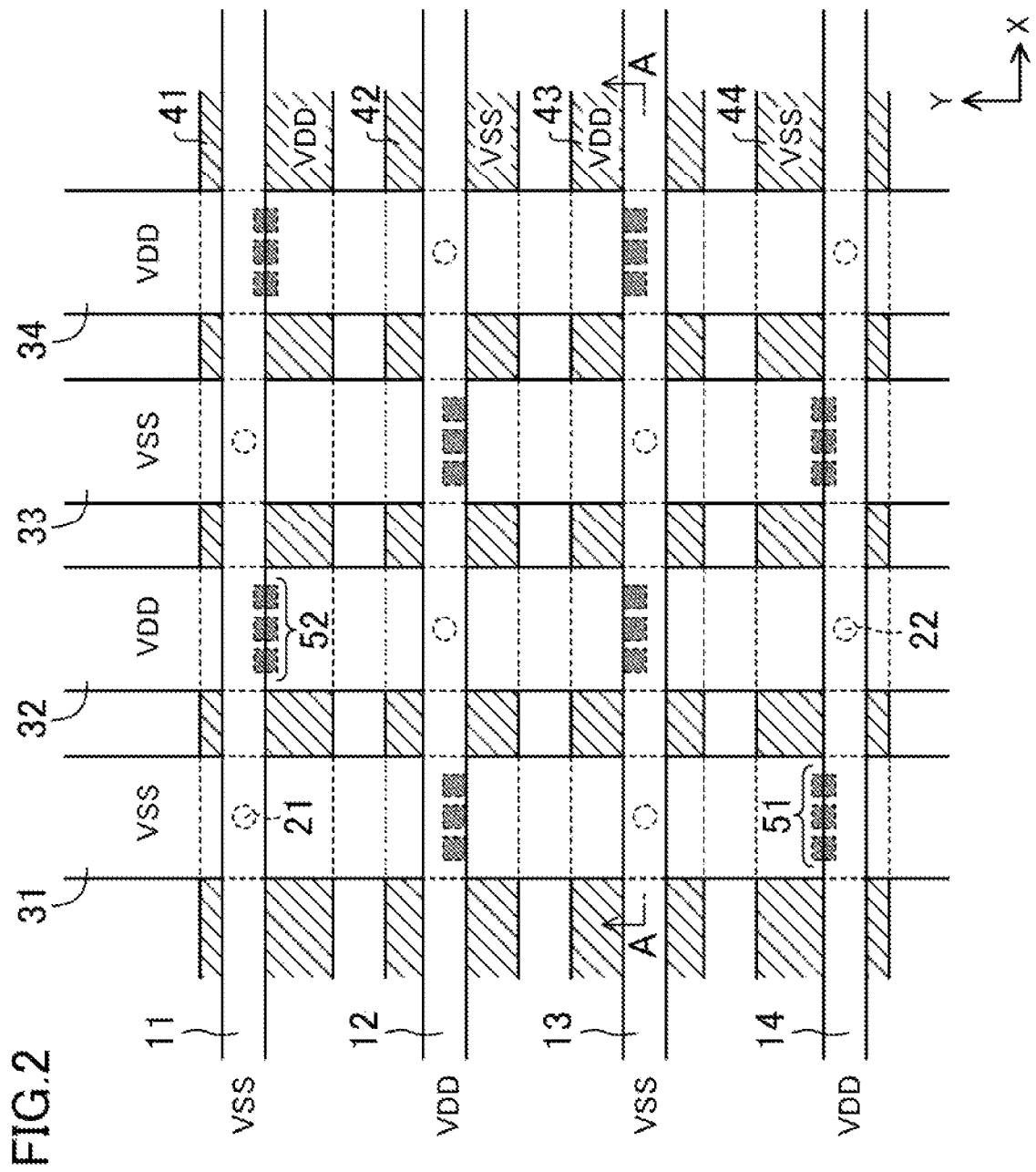

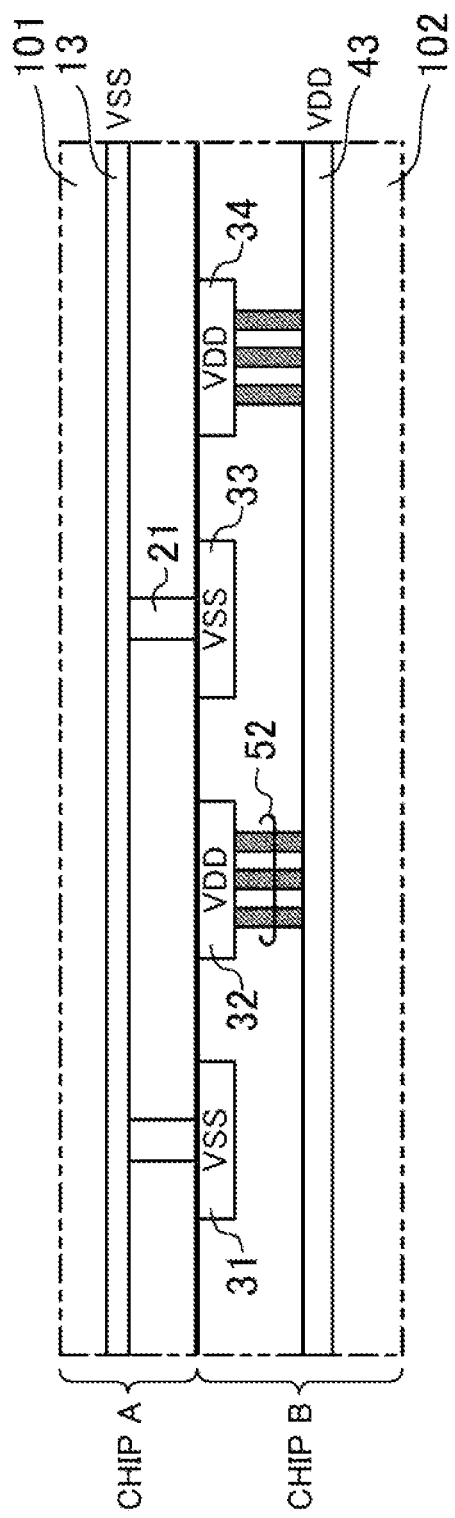

SEMICONDUCTOR INTEGRATED CIRCUIT DEVICE AND SEMICONDUCTOR PACKAGE STRUCTURE

CROSS-REFERENCE TO RELATED APPLICATIONS

This is a continuation of International Application No. PCT/JP2019/036598 filed on Sep. 18, 2019, which claims priority to Japanese Patent Application No. 2018-183553 filed on Sep. 28, 2018. The entire disclosures of these applications are incorporated by reference herein.

BACKGROUND

The present disclosure relates to a semiconductor integrated circuit device in which semiconductor chips are stacked one on top of the other.

To achieve higher degrees of integration of semiconductor integrated circuits, semiconductor processes have been increasingly made finer. With the processes becoming finer, reduction in power supply voltage is advancing, and this increases the influences of a power supply voltage drop and power supply noise. To prevent or reduce the influences, power supply lines may be thickened, for example, to reduce the resistance. If such measures are taken, however, a wiring region for signal lines may be used for power supply lines, resulting in blocking achievement of higher degrees of integration of semiconductor integrated circuits.

U.S. Pat. No. 8,035,194 (Patent Document 1) discloses a technology in which, in a semiconductor device including first and second semiconductor chips stacked one on top of the other, power is supplied from the second semiconductor chip to the first semiconductor chip through a through silicon via (TSV) formed in the first semiconductor chip. United States Patent Application Publication No. 2017/0062421 (Patent Document 2) discloses a technology of supplying power to a semiconductor integrated circuit through a buried interconnect (BI) provided inside the substrate.

SUMMARY

In Patent Document 1, however, no detailed examination has been made on the structure of power supply lines in the stacked first and second semiconductor chips. Also, in Patent Document 2, no examination has been made on how power should be supplied to the buried interconnect.

An objective of the present disclosure is providing a novel structure of power supply lines for more effective power supply in a semiconductor integrated circuit device including semiconductor chips stacked one on top of the other.

In a first mode of the present disclosure, a semiconductor integrated circuit device includes: a first semiconductor chip; and a second semiconductor chip, the first and second semiconductor chips being stacked one on top of the other, wherein a back surface of the first semiconductor chip and a principal surface of the second semiconductor chip face each other, the first semiconductor chip includes a plurality of transistors, a plurality of first power supply lines extending in a first direction, arranged in a second direction perpendicular to the first direction, for supplying a first power supply voltage to the plurality of transistors, and a plurality of first vias formed from the back surface of the first semiconductor chip to reach the first power supply lines, the second semiconductor chip includes a plurality of second power supply lines formed in a first wiring layer that is a wiring layer closest to the principal surface of the second semiconductor chip, the second power supply lines extending in the second direction and arranged in the first direction, and the first power supply lines are connected with the second power supply lines through the plurality of first vias.

According to the above mode, in the first semiconductor chip provided with a plurality of transistors, the first power supply lines are connected with the second power supply lines in the second semiconductor chip through a plurality of first vias. Therefore, by sufficiently providing power supply lines in the second semiconductor chip, power can be supplied through low-resistance power supply lines without the need to provide power supply lines other than the first power supply lines in the first semiconductor chip. Also, since the first power supply lines in the first semiconductor chip and the second power supply lines in the second semiconductor chip extend in directions orthogonal to each other, they can be connected with each other through the plurality of the first vias even if they have different wiring pitches from each other. This makes it possible to fabricate the first and second semiconductor chips in different processes from each other. Thus, using a mature process or using only a wiring layer process, for example, the semiconductor integrated circuit device can be fabricated at a lower cost.

In a second mode of the present disclosure, a semiconductor integrated circuit device includes: a first semiconductor chip; and a second semiconductor chip, the first and second semiconductor chips being stacked one on top of the other, wherein a back surface of the first semiconductor chip and a principal surface of the second semiconductor chip face each other, the first semiconductor chip includes a plurality of transistors, a plurality of first power supply lines extending in a first direction, arranged at a first pitch in a second direction perpendicular to the first direction, for supplying a first power supply voltage to the plurality of transistors, and a plurality of first vias formed from the back surface of the first semiconductor chip to reach the first power supply lines, the second semiconductor chip includes a plurality of second power supply lines formed in a first wiring layer that is a wiring layer closest to the principal surface of the second semiconductor chip, extending in the first direction and arranged at the first pitch in the second direction, and the first power supply lines are connected with the second power supply lines through the plurality of first vias.

According to the above mode, in the first semiconductor chip provided with a plurality of transistors, the first power supply lines are connected with the second power supply lines in the second semiconductor chip through a plurality of first vias. Therefore, by sufficiently providing power supply lines in the second semiconductor chip, power can be supplied through low-resistance power supply lines without the need to provide power supply lines other than the first power supply lines in the first semiconductor chip. Also, since the first power supply lines in the first semiconductor chip and the second power supply lines in the second semiconductor chip extend in the same first direction and are arranged at the same first pitch, the plurality of first vias can be provided over the entire first and second power supply lines in the first direction. This makes it possible to reduce the resistance of the power supply lines caused by the plurality of first vias.

In a third mode of the present disclosure, a semiconductor integrated circuit device includes: a first semiconductor chip; and a second semiconductor chip, the first and second semiconductor chips being stacked one on top of the other, wherein a back surface of the first semiconductor chip and a principal surface of the second semiconductor chip face each other, the first semiconductor chip includes a plurality of transistors, a plurality of first power supply lines extending in a first direction, arranged in a second direction perpendicular to the first direction, for supplying a first power supply voltage to the plurality of transistors, a plurality of second power supply lines extending in the first direction, arranged in the second direction, for supplying a second power supply voltage to the plurality of transistors, a plurality of first vias formed from the back surface of the first semiconductor chip to reach the first power supply lines, and a plurality of second vias formed from the back surface of the first semiconductor chip to reach the second power supply lines, the second semiconductor chip includes a third power supply line formed in a first wiring layer that is a wiring layer closest to the principal surface of the second semiconductor chip, the third power supply line having an opening, and a fourth power supply line formed in the opening of the third power supply line in the first wiring layer, the first power supply lines are connected with the third power supply line through the plurality of first vias, and the second power supply lines are connected with the fourth power supply line through the plurality of second vias.

According to the above mode, in the first semiconductor chip provided with a plurality of transistors, the first power supply lines are connected with the third power supply line in the second semiconductor chip through a plurality of first vias, and the second power supply lines are connected with the fourth power supply line in the second semiconductor chip through a plurality of second vias. The fourth power supply line is formed in an opening of the third power supply line. Therefore, by sufficiently providing power supply lines in the second semiconductor chip, power can be supplied through low-resistance power supply lines without the need to provide power supply lines other than the first and second power supply lines in the first semiconductor chip. Also, in the second semiconductor chip, since the fourth power supply line is formed in the opening of the third power supply line, the third power supply line can be formed as a widely expanded area having overlaps with the first power supply lines as viewed in plan. With this, the resistance of the third power supply line can be reduced, and also the plurality of first vias can be provided over the entire first power supply lines in the first direction.

In another mode of the present disclosure, a semiconductor package structure includes: a package substrate having a power supply external terminal provided on one surface; and the semiconductor integrated circuit device of the first or second mode mounted on the other surface of the package substrate, and the second power supply lines in the second semiconductor chip of the semiconductor integrated circuit device are electrically connected to the external terminal.

In yet another mode of the present disclosure, a semiconductor package structure includes: a package substrate having a power supply external terminal provided on one surface; and the semiconductor integrated circuit device of the third mode mounted on the other surface of the package substrate, and the third power supply line in the second semiconductor chip of the semiconductor integrated circuit device is electrically connected to the external terminal.

According to the present disclosure, power can be supplied more effectively in a semiconductor integrated circuit device including semiconductor chips stacked one on top of the other.

BRIEF DESCRIPTION OF THE DRAWINGS

FIG. 2 is a plan view showing a structure of power supply lines in the first embodiment.

FIG. 3 is a cross-sectional view of the structure of FIG. 2.

DETAILED DESCRIPTION

Embodiments of the present disclosure will be described hereinafter with reference to the accompanying drawings. Note in the following description that, in the plan views such as FIG. 2, the horizontal direction is referred to as the X direction (corresponding to the first direction) and the vertical direction is referred to as the Y direction (corresponding to the second direction). Note also that "VDD" refers to a power supply voltage or a high-voltage side power supply line, and "VSS" refers to a power supply voltage or a low-voltage side power supply line. Also, as used herein, an expression indicating that pitches, etc. are identical, such as "the same pitch," is to be understood as including a range of manufacturing variations.

First Embodiment

Figure 1:
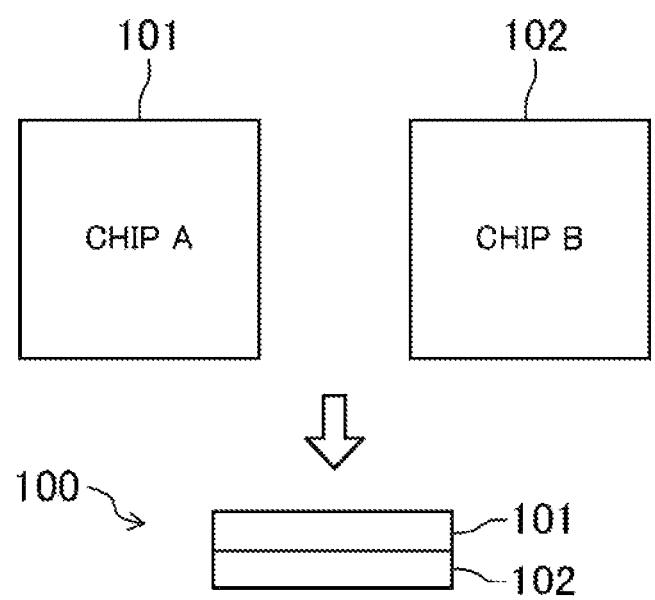
FIG. 1 shows an entire configuration of a semiconductor integrated circuit device according to an embodiment.

FIG. 1 is a view showing an entire configuration of a semiconductor integrated circuit device according to an embodiment. As shown in FIG. 1, the semiconductor integrated circuit device 100 is constructed by stacking a first semiconductor chip 101 (chip A) and a second semiconductor chip 102 (chip B) one on top of the other. In the first semiconductor chip 101, circuits including a plurality of transistors are formed. In the second semiconductor chip 102, no elements such as transistors are formed, but power supply lines formed in a plurality of wiring layers are provided. The back surface of the first semiconductor chip 101 and the principal surface of the second semiconductor chip 102 face each other on the interface between the stacked chips.

FIG. 2 shows a configuration of a semiconductor integrated circuit device according to the first embodiment, which is a plan view showing a structure of power supply lines in a neighborhood of the interface between the stacked first semiconductor chip 101 and second semiconductor chip 102. FIG. 3 is a cross-sectional view taken along line A-A in FIG. 2.

In the first semiconductor chip 101, power supply lines 11, 12, 13, and 14 are formed to extend in the X direction. The power supply lines 11, 12, 13, and 14 supply power to a plurality of transistors formed in the first semiconductor chip 101, where the power supply lines 11 and 13 supply VSS and the power supply lines 12 and 14 supply VDD. The power supply lines 11, 12, 13, and 14 are arranged at a predetermined pitch in the Y direction. That is, the power supply lines 11 and 13 for supply of VSS are arranged at a predetermined pitch in the Y direction, and the power supply lines 12 and 14 for supply of VDD are arranged at a predetermined pitch in the Y direction.

The power supply lines 11, 12, 13, and 14 are buried interconnects provided inside the substrate of the first semiconductor chip 101 (as used herein, power supply lines formed as buried interconnects are referred to as buried power rails (BPRs)) and are formed using a material such as W, Co, and Ru, for example. It is herein assumed that no power supply lines are formed above the BPRs in the first semiconductor chip 101.

In the second semiconductor chip 102, power supply lines 31, 32, 33, and 34 extending in the Y direction are formed in a first wiring layer that is the uppermost layer (wiring layer closest to the principal surface). The power supply lines 31 and 33 supply VSS and the power supply lines 32 and 34 supply VDD. The power supply lines 31, 32, 33, and 34 are arranged at a predetermined pitch in the X direction. That is, the power supply lines 31 and 33 for supply of VSS are arranged at a predetermined pitch in the X direction, and the power supply lines 32 and 34 for supply of VDD are arranged at a predetermined pitch in the X direction.

In the second semiconductor chip 102, also, power supply lines 41, 42, 43, and 44 (hatched in FIG. 2) extending in the X direction are formed in a second wiring layer that is a layer immediately below the first wiring layer. The power supply lines 41 and 43 supply VDD and the power supply lines 42 and 44 supply VSS. The power supply lines 41, 42, 43, and 44 are arranged at a predetermined pitch in the Y direction. That is, the power supply lines 41 and 43 for supply of VDD are arranged at a predetermined pitch in the Y direction, and the power supply lines 42 and 44 for supply of VSS are arranged at a predetermined pitch in the Y direction.

A plurality of vias 51 are formed at positions where the power supply lines 31 and 33 in the first wiring layer and the power supply lines 42 and 44 in the second wiring layer overlap each other as viewed in plan. That is, the power supply lines 31 and 33 and the power supply lines 42 and 44, both for supply of VSS, are connected through the vias 51. Also, a plurality of vias 52 are formed at positions where the power supply lines 32 and 34 in the first wiring layer and the power supply lines 41 and 43 in the second wiring layer overlap each other as viewed in plan. That is, the power supply lines 32 and 34 and the power supply lines 41 and 43, both for supply of VDD, are connected through the vias 52.

In the first semiconductor chip 101, a plurality of vias 21 and 22 are formed from the back surface to reach the power supply lines 11, 12, 13, and 14. The plurality of vias 21 are formed at positions where the power supply lines 11 and 13 in the first semiconductor chip 101 overlap the power supply lines 31 and 33 in the first wiring layer of the second semiconductor chip 102 as viewed in plan. That is, the power supply lines 11 and 13 and the power supply lines 31 and 33, both for supply of VSS, are connected through the vias 21. Also, the plurality of vias 22 are formed at positions where the power supply lines 12 and 14 in the first semiconductor chip 101 overlap the power supply lines 32 and 34 in the first wiring layer of the second semiconductor chip 102 as viewed in plan. That is, the power supply lines 12 and 14 and the power supply lines 32 and 34, both for supply of VDD, are connected through the vias 22.

In other words, for the power supply voltage VSS, the power supply lines 11 and 13 in the first semiconductor chip 101, the power supply lines 31 and 33 in the first wiring layer of the second semiconductor chip 102, and the power supply lines 42 and 44 in the second wiring layer of the second semiconductor chip 102 are mutually connected. Also, for the power supply voltage VDD, the power supply lines 12 and 14 in the first semiconductor chip 101, the power supply lines 32 and 34 in the first wiring layer of the second semiconductor chip 102, and the power supply lines 41 and 43 in the second wiring layer of the second semiconductor chip 102 are mutually connected.

Figure 4A:
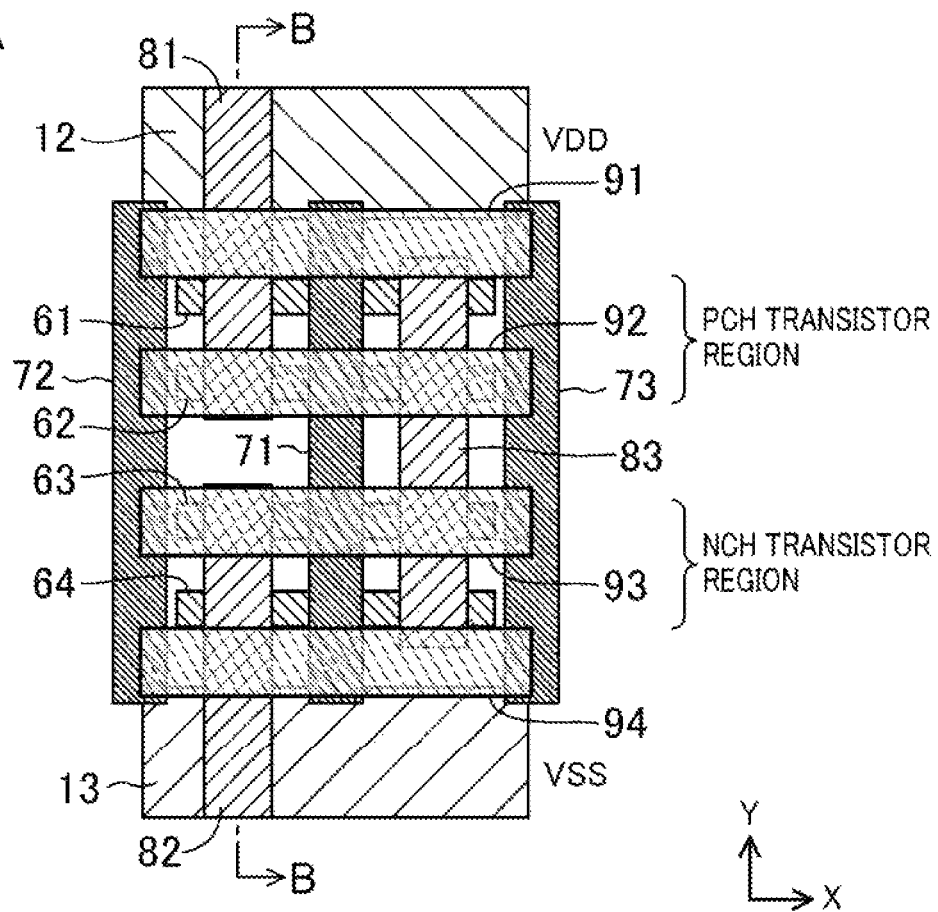
FIGS. 4A and 4B show a configuration example of a standard cell formed in a first semiconductor chip in the first embodiment.
Figure 4B:
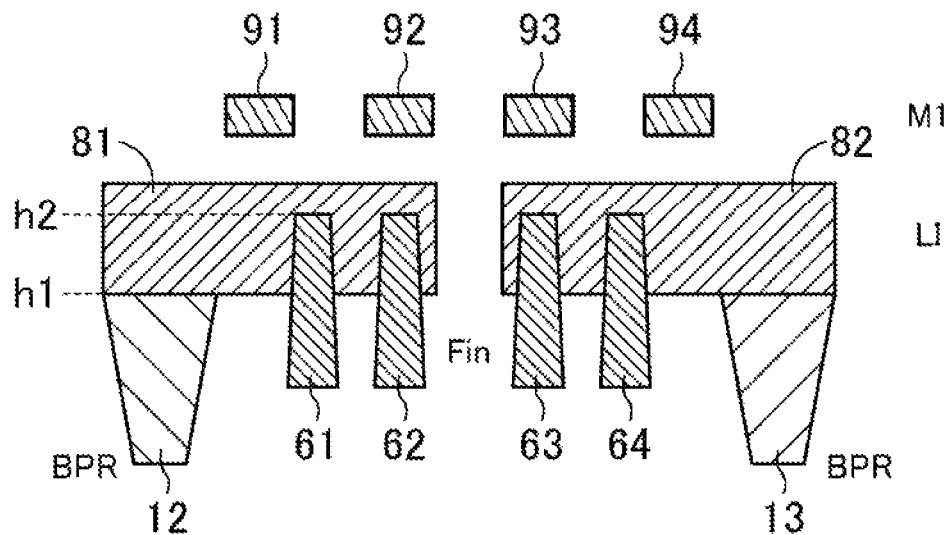

FIGS. 4A and 4B show a configuration example of a standard cell formed in the first semiconductor chip 101, where FIG. 4A is a plan view and FIG. 4B is a cross-sectional view taken along line B-B in FIG. 4A. In the first semiconductor chip 101, standard cells such as one in FIGS. 4A and 4B are arranged in the X direction to form a cell row. Such cell rows are arranged in the Y direction, where the configuration is inverted vertically (in the Y direction) every row and adjacent cell rows share the power supply lines.

The standard cell of FIGS. 4A and 4B is formed between the power supply line 12 for supply of VDD and the power supply line 13 for supply of VSS. Two fins 61 and 62 extending in the X direction are formed in a Pch transistor region, and two fins 63 and 64 extending in the X direction are formed in an Nch transistor region. A gate interconnect 71 is formed to extend in the Y direction, and dummy gate interconnects 72 and 73 are formed on both sides of the gate interconnect 71. A p-type fin transistor is formed by the fins 61 and 62 and the gate interconnect 71, and an n-type fin transistor is formed by the fins 63 and 64 and the gate interconnect 71.

Local interconnects 81, 82, and 83 are formed to extend in the Y direction. The local interconnect 81 connects the power supply line 12 with the fins 61 and 62, the local interconnect 82 connects the power supply line 13 with the fins 63 and 64, and the local interconnect 83 connects the fins 61 and 62 with the fins 63 and 64. Also, in an upper wiring layer (M1 wiring layer), formed are signal lines 91, 92, 93, and 94 extending in the X direction.

Since the power supply lines 12 and 13 are buried interconnects as described above, the top h1 of the power supply lines 12 and 13 is at a position lower than the top h2 of the fins 61, 62, 63, and 64 forming the transistors. Note that the power supply lines 12 and 13 are connected with the local interconnects 81 and 82 directly or through vias.

Although the fin transistors are formed in the example of FIGS. 4A and 4B, the transistors are not limited to this type, but other three-dimensional transistors such as nanowire transistors may be formed. In a standard cell having nanowire transistors, the top of power supply lines should be at a position lower than the top of nanowires forming the transistors.

According to this embodiment, in the first semiconductor chip 101 provided with a plurality of transistors, the power supply lines 11 and 13 as BPRs for supply of VSS are connected with the power supply lines 31 and 33 in the second semiconductor chip 102 through the vias 21. Also, in the first semiconductor chip 101, the power supply lines 12 and 14 as BPRs for supply of VDD are connected with the power supply lines 32 and 34 in the second semiconductor chip 102 through the vias 22. Therefore, by sufficiently providing power supply lines in the second semiconductor chip 102, power can be supplied through low-resistance power supply lines without the need to provide power supply lines other than BPRs in the first semiconductor chip 101.

Also, since the power supply lines 11 to 14 in the first semiconductor chip 101 and the power supply lines 31 to 34 in the second semiconductor chip 102 extend in directions orthogonal to each other, they can be connected with each other through the vias 21 and 22 even if they have different wiring pitches from each other. This makes it possible to fabricate the first and second semiconductor chips 101 and 102 in different processes from each other. Thus, using a mature process or using only a wiring layer process, for example, the semiconductor integrated circuit device 100 can be fabricated at a lower cost.

Figure 5:
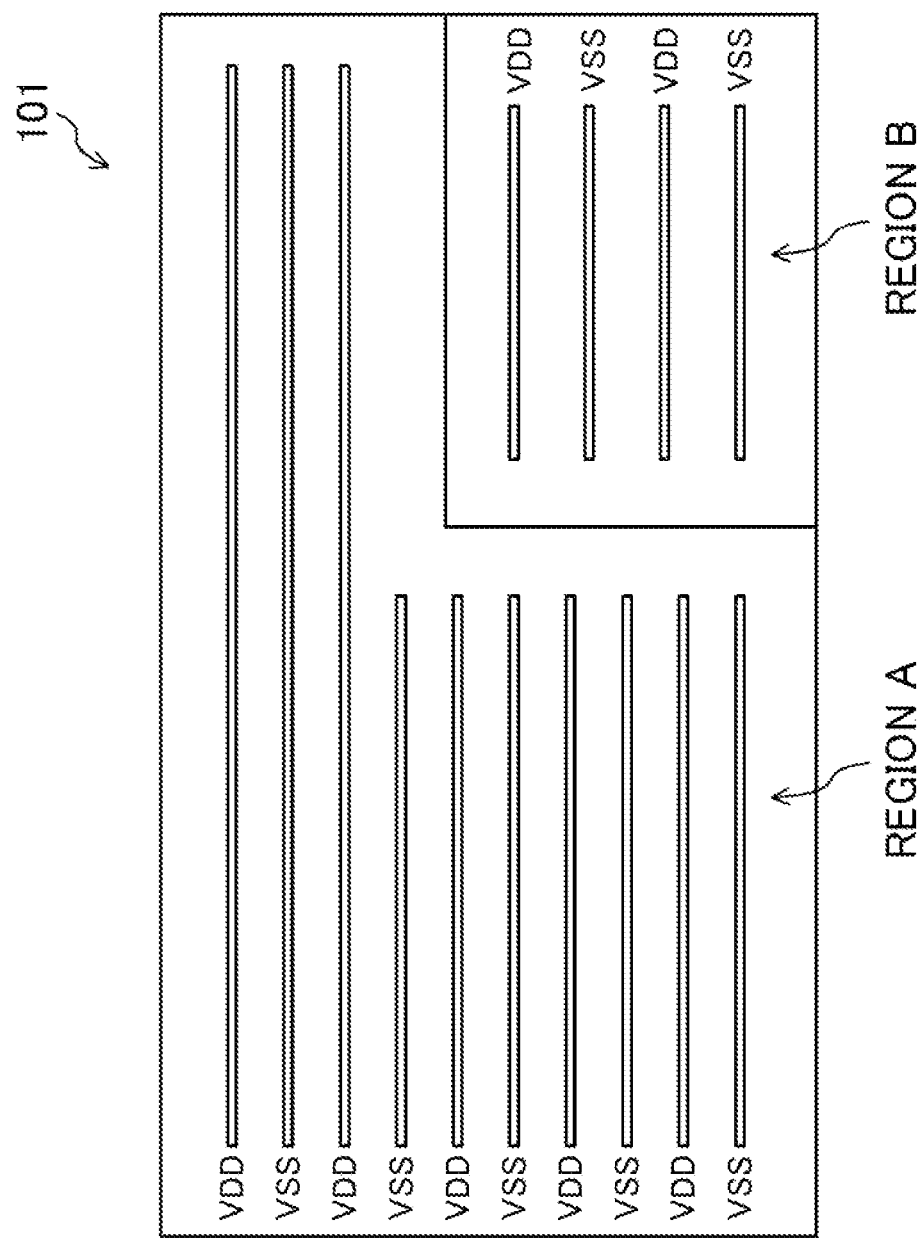
FIG. 5 is a conceptional view of a semiconductor chip having regions different in the arrangement pitch of power supply lines.

In the first semiconductor chip 101, the arrangement pitch of the power supply lines does not need to be uniform over the entire chip. For example, as shown in FIG. 5, the arrangement pitch of power supply lines may differ with regions. In the example of FIG. 5, the arrangement pitch of power supply lines is greater in region B than in region A. For example, region A may be constituted by standard cells having the same cell height as the standard cell exemplified in FIGS. 4A and 4B, and region B may be constituted by standard cells higher in cell height than the exemplified standard cell. Otherwise, region B may be an IO region, a memory region, or an analog region. Although two arrangement pitches of power supply lines are shown in FIG. 5, three or more arrangement pitches may be used for power supply lines in the first semiconductor chip 101.

Although it is assumed in this embodiment that no power supply lines are formed above the power supply lines 11, 12, 13, and 14 as BPRs in the first semiconductor chip 101, it is acceptable to form power supply lines above the BPRs. Also, although it is assumed in this embodiment that no elements such as transistors are formed in the second semiconductor chip 102, it is acceptable to form elements such as transistors.

(Alteration 1)

Figure 6:
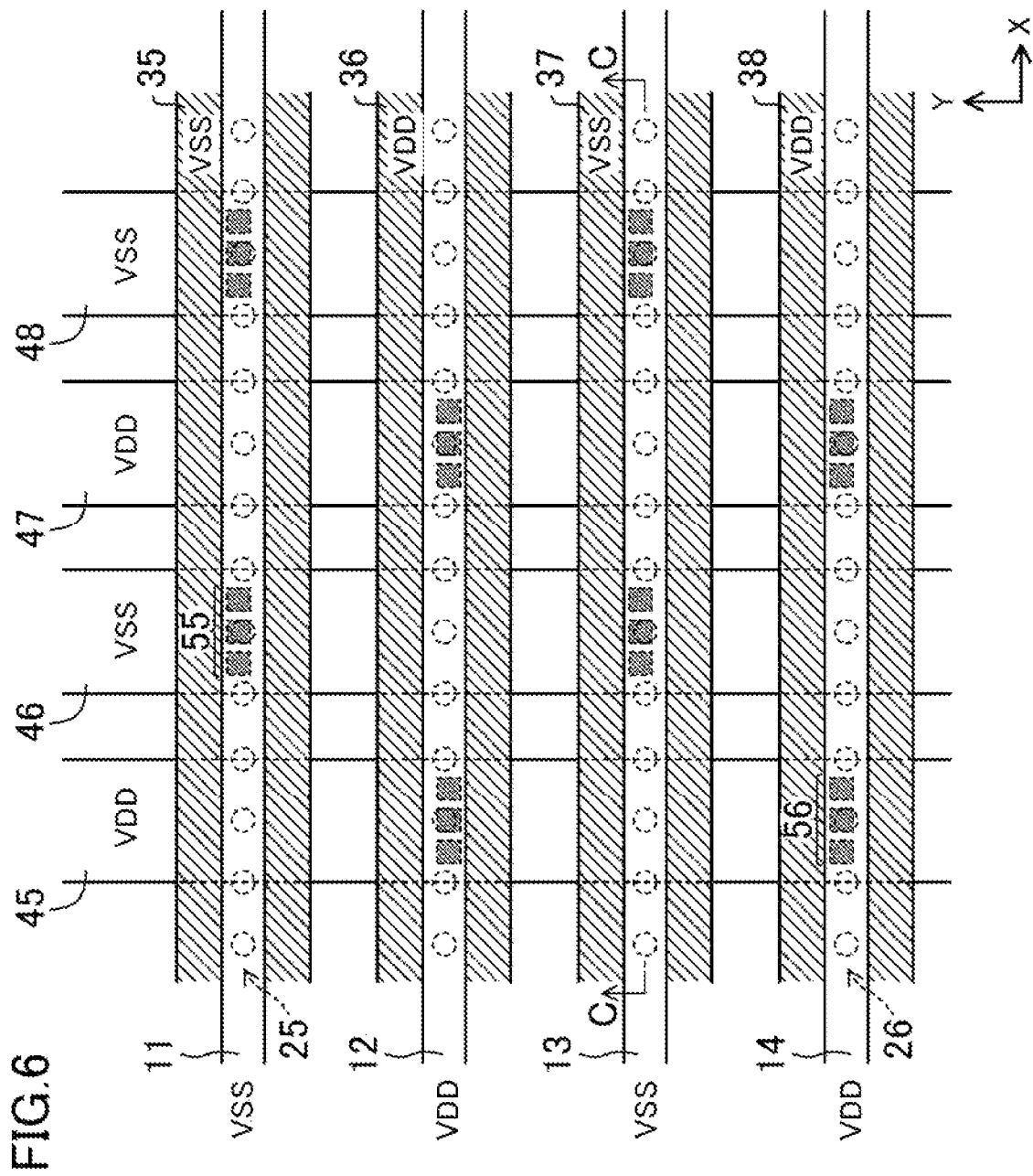
FIG. 6 is a plan view showing a structure of power supply lines in Alteration 1 of the first embodiment.
Figure 7:
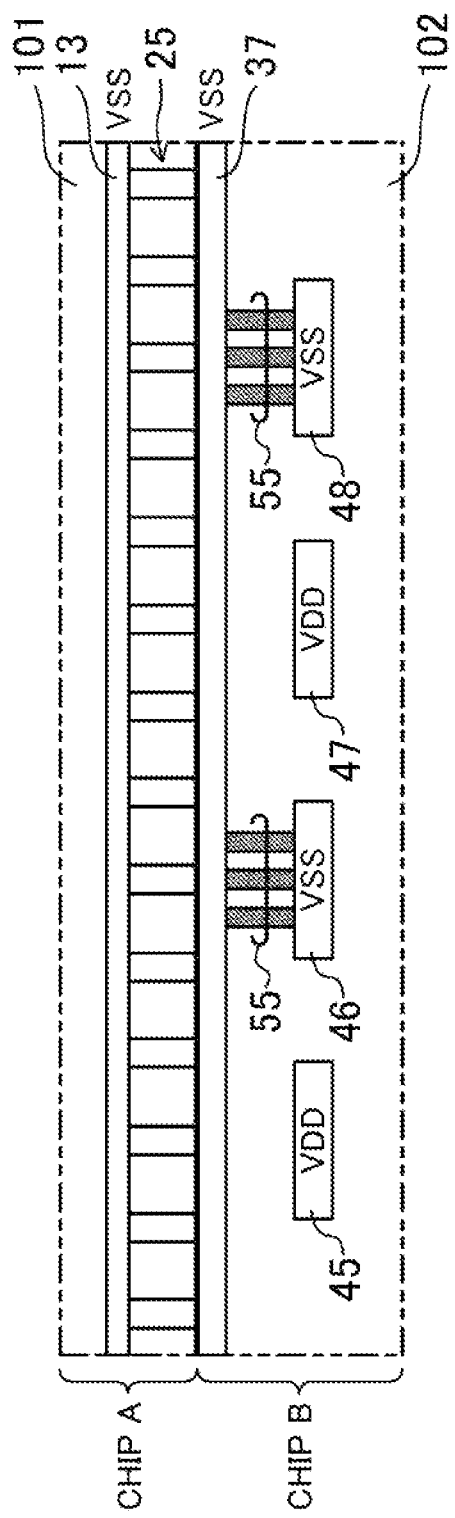
FIG. 7 is a cross-sectional view of the structure of FIG. 6.

FIG. 6 shows a configuration of a semiconductor integrated circuit device according to Alteration 1 of the first embodiment, which is a plan view showing a structure of power supply lines in a neighborhood of the interface between the stacked first semiconductor chip 101 and second semiconductor chip 102. FIG. 7 is a cross-sectional view taken along line C-C in FIG. 6.

In this alteration, the power supply lines 11, 12, 13, and 14 are formed to extend in the X direction in the first semiconductor chip 101, as in the embodiment described above. In the second semiconductor chip 102, however, power supply lines 35, 36, 37, and 38 (hatched in FIG. 6) formed in a first wiring layer extend in the X direction, and power supply lines 45, 46, 47, and 48 formed in a second wiring layer extend in the Y direction.

In other words, in the second semiconductor chip 102, the power supply lines 35, 36, 37, and 38 extending in the X direction are formed in the first wiring layer, where the power supply lines 35 and 37 supply VSS and the power supply lines 36 and 38 supply VDD. The power supply lines 35, 36, 37, and 38 are arranged in the Y direction at the same pitch as the power supply lines 11, 12, 13, and 14 formed in the first semiconductor chip 101. That is, the power supply lines 35 and 37 for supply of VSS are arranged in the Y direction at the same pitch as the power supply lines 11 and 13, and the power supply lines 36 and 38 for supply of VDD are arranged in the Y direction at the same pitch as the power supply lines 12 and 14.

Also, in the second semiconductor chip 102, the power supply lines 45, 46, 47, and 48 extend in the Y direction in the second wiring layer, where the power supply lines 45 and 47 supply VDD and the power supply lines 46 and 48 supply VSS. The power supply lines 45, 46, 47, and 48 are arranged at a predetermined pitch in the X direction. That is, the power supply lines 45 and 47 for supply of VDD are arranged at a predetermined pitch in the X direction, and the power supply lines 46 and 48 for supply of VSS are arranged at a predetermined pitch in the X direction.

A plurality of vias 55 are formed at positions where the power supply lines 35 and 37 in the first wiring layer and the power supply lines 46 and 48 in the second wiring layer overlap each other as viewed in plan. That is, the power supply lines 35 and 37 and the power supply lines 46 and 48, both for supply of VSS, are connected through the vias 55. Also, a plurality of vias 56 are formed at positions where the power supply lines 36 and 38 in the first wiring layer and the power supply lines 45 and 47 in the second wiring layer overlap each other as viewed in plan. That is, the power supply lines 36 and 38 and the power supply lines 45 and 47, both for supply of VDD, are connected through the vias 56.

The power supply line 11 in the first semiconductor chip 101 and the power supply line 35 in the first wiring layer of the second semiconductor chip 102 overlap each other as viewed in plan. Likewise, the power supply lines 12, 13, and 14 in the first semiconductor chip 101 respectively overlap the power supply lines 36, 37, and 38 in the first wiring layer of the second semiconductor chip 102 as viewed in plan.

In the first semiconductor chip 101, a plurality of vias 25 and 26 are formed from the back surface to reach the power supply lines 11, 12, 13, and 14. A plurality of vias 25 are formed to line up in the X direction in a region where the power supply line 11 in the first semiconductor chip 101 overlaps the power supply line 35 in the first wiring layer of the second semiconductor chip 102 as viewed in plan. That is, the power supply line 11 and the power supply line 35, both for supply of VSS, are connected through the vias 25. Also, a plurality of vias 25 are formed to line up in the X direction in a region where the power supply line 13 in the first semiconductor chip 101 overlaps the power supply line 37 in the first wiring layer of the second semiconductor chip 102 as viewed in plan. That is, the power supply line 13 and the power supply line 37, both for supply of VSS, are connected through the vias 25.

A plurality of vias 26 are formed to line up in the X direction in a region where the power supply line 12 in the first semiconductor chip 101 overlaps the power supply line 36 in the first wiring layer of the second semiconductor chip 102 as viewed in plan. That is, the power supply line 12 and the power supply line 36, both for supply of VDD, are connected through the vias 26. Also, a plurality of vias 26 are formed to line up in the X direction in a region where the power supply line 14 in the first semiconductor chip 101 overlaps the power supply line 38 in the first wiring layer of the second semiconductor chip 102 as viewed in plan. That is, the power supply line 14 and the power supply line 38, both for supply of VDD, are connected through the vias 26.

According to this alteration, in the first semiconductor chip 101 provided with a plurality of transistors, the power supply lines 11 and 13 as BPRs for supply of VSS are connected with the power supply lines 35 and 37 in the second semiconductor chip 102 through the vias 25. Also, in the first semiconductor chip 101, the power supply lines 12 and 14 as BPRs for supply of VDD are connected with the power supply lines 36 and 38 in the second semiconductor chip 102 through the vias 26. Therefore, by sufficiently providing power supply lines in the second semiconductor chip 102, power can be supplied through low-resistance power supply lines without the need to provide power supply lines other than BPRs in the first semiconductor chip 101.

Also, in this alteration, the power supply lines 11 to 14 in the first semiconductor chip 101 and the power supply lines 35 to 38 in the second semiconductor chip 102 extend in the same X direction and are arranged at the same pitch. Therefore, the vias 25 and 26 can be provided over the entire of the power supply lines 11 to 14 and the power supply regions 35 to 38 in the X direction. This makes it possible to reduce the resistance of the power supply lines caused by the vias 25 and 26.

(Alteration 2)

Figure 8:
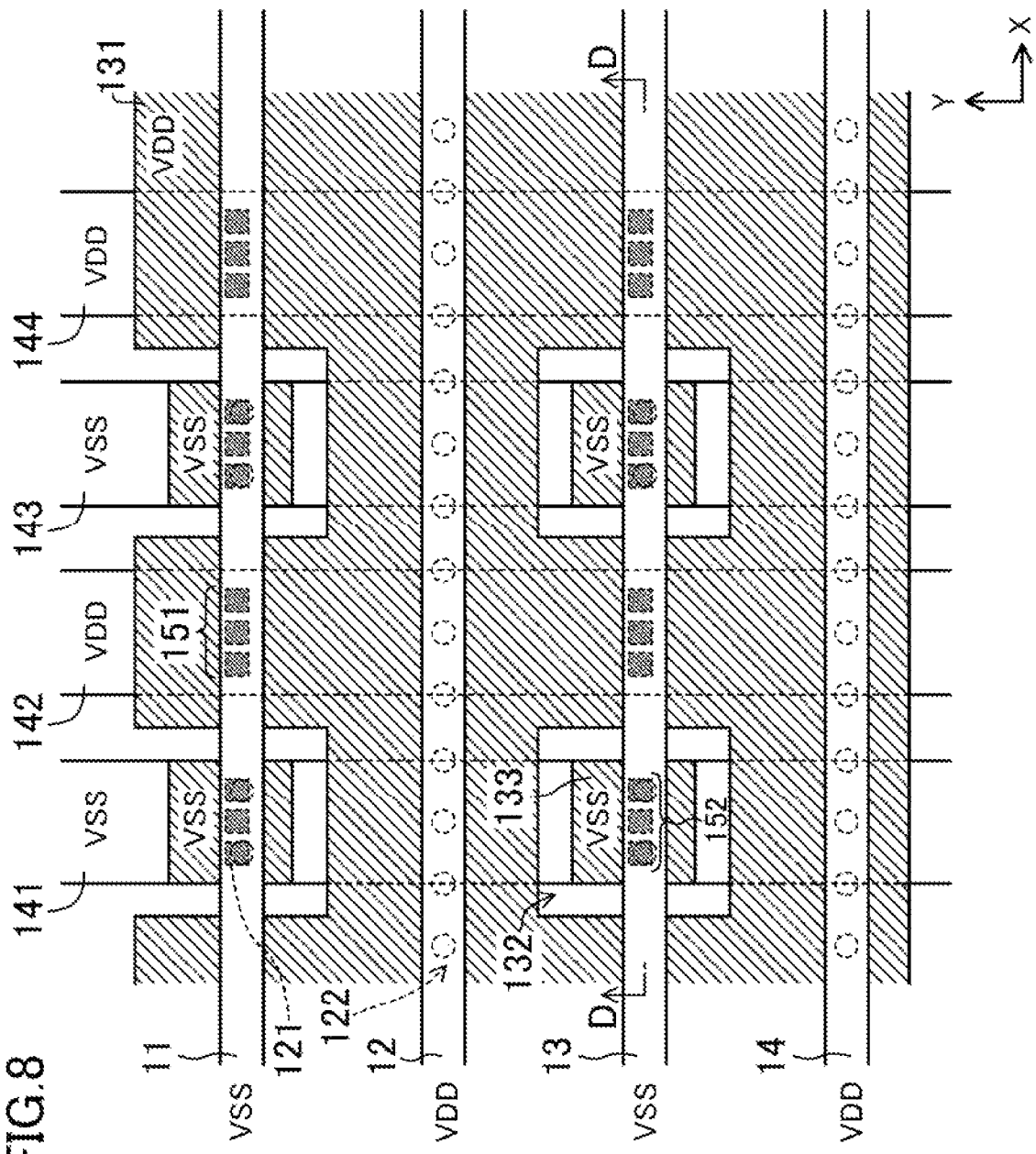
FIG. 8 is a plan view showing a structure of power supply lines in Alteration 2 of the first embodiment.
Figure 9:
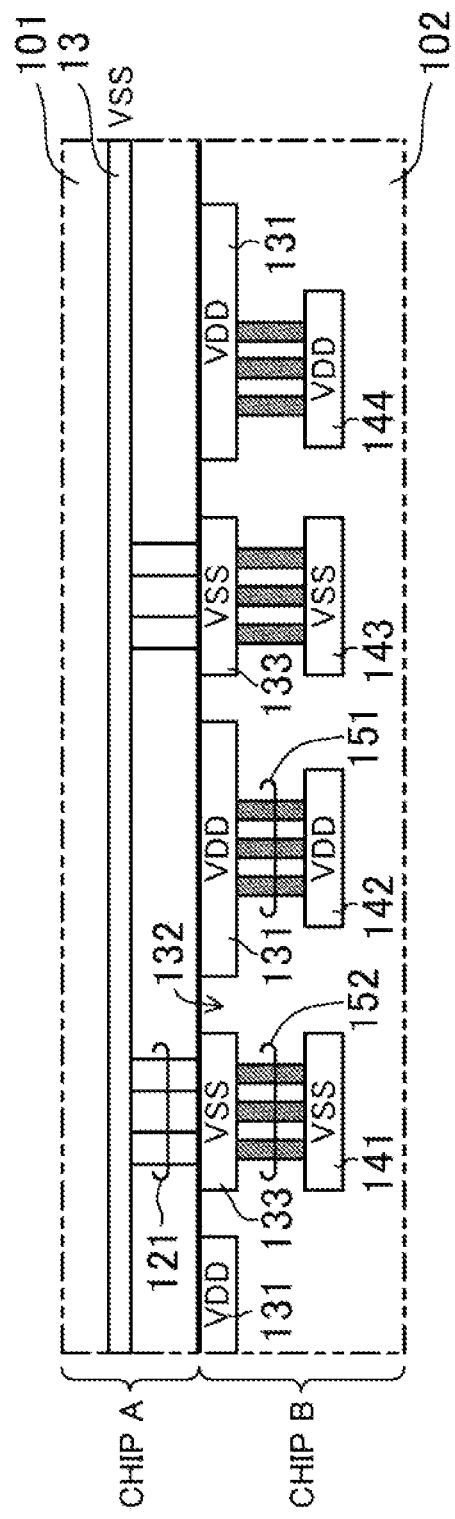
FIG. 9 is a cross-sectional view of the structure of FIG. 8.

FIG. 8 shows a configuration of a semiconductor integrated circuit device according to Alteration 2 of the first embodiment, which is a plan view showing a structure of power supply lines in a neighborhood of the interface between the stacked first semiconductor chip 101 and second semiconductor chip 102. FIG. 9 is a cross-sectional view taken along line D-D in FIG. 8.

In this alteration, the power supply lines 11, 12, 13, and 14 are formed to extend in the X direction in the first semiconductor chip 101, as in the embodiment described above. In the first wiring layer of the second semiconductor chip 102, however, a power supply line 131 having openings 132 is formed. Inside the openings 132, power supply lines 133 are formed.

That is, the second semiconductor chip 102 has the power supply line 131 expanded in a planar fashion (hatched in FIG. 8) in the first wiring layer. The power supply line 131, which supplies VDD, has the openings 132 at positions overlapping the power supply lines 11 and 13 for supply of VSS in the first semiconductor chip 101 as viewed in plan. The power supply lines 133 (hatched in FIG. 8), which supply VSS, are formed in the openings 132.

Also, in the second semiconductor chip 102, power supply lines 141, 142, 143, and 144 extending in the Y direction are formed in the second wiring layer, where the power supply lines 141 and 143 supply VSS and the power supply lines 142 and 144 supply VDD. The power supply lines 141, 142, 143, and 144 are arranged at a predetermined pitch in the X direction. That is, the power supply lines 141 and 143 for supply of VSS are arranged at a predetermined pitch in the X direction, and the power supply lines 142 and 144 for supply of VDD are arranged at a predetermined pitch in the X direction.

A plurality of vias 151 are formed at positions where the power supply line 131 in the first wiring layer and the power supply lines 142 and 144 in the second wiring layer overlap each other as viewed in plan. That is, the power supply line 131 and the power supply lines 142 and 144, both for supply of VDD, are connected through the vias 151. Also, a plurality of vias 152 are formed at positions where the power supply lines 133 in the first wiring layer and the power supply lines 141 and 143 in the second wiring layer overlap each other as viewed in plan. That is, the power supply lines 133 and the power supply lines 141 and 143, both for supply of VSS, are connected through the vias 152.

The power supply lines 11 and 13 in the first semiconductor chip 101 and the power supply lines 133 in the first wiring layer of the second semiconductor chip 102 overlap each other as viewed in plan. The power supply lines 12 and 14 in the first semiconductor chip 101 and the power supply line 131 in the first wiring layer of the second semiconductor chip 102 overlap each other as viewed in plan.

In the first semiconductor chip 101, a plurality of vias 121 and 122 are formed from the back surface to reach the power supply lines 11, 12, 13, and 14. The plurality of vias 121 are formed in regions where the power supply lines 11 and 13 in the first semiconductor chip 101 overlap the power supply lines 133 in the first wiring layer of the second semiconductor chip 102 as viewed in plan. That is, the power supply lines 11 and 13 and the power supply lines 133, both for supply of VSS, are connected through the vias 121. Also, the plurality of vias 122 are formed to line up in the X direction in regions where the power supply lines 12 and 14 in the first semiconductor chip 101 overlap the power supply line 131 in the first wiring layer of the second semiconductor chip 102 as viewed in plan. That is, the power supply lines 12 and 14 and the power supply line 131, both for supply of VDD, are connected through the vias 122.

According to this alteration, in the first semiconductor chip 101 provided with a plurality of transistors, the power supply lines 12 and 14 as BPRs for supply of VDD are connected with the power supply line 131 in the second semiconductor chip 102 through the vias 122. Also, in the first semiconductor chip 101, the power supply lines 11 and 13 as BPRs for supply of VSS are connected with the power supply lines 133 in the second semiconductor chip 102 through the vias 121. Therefore, by sufficiently providing power supply lines in the second semiconductor chip 102, power can be supplied through low-resistance power supply lines without the need to provide power supply lines other than BPRs in the first semiconductor chip 101.

Also, in the second semiconductor chip 102, since the power supply lines 133 are formed in the openings 132 of the power supply line 131, the power supply line 131 can be formed as a widely expanded area having overlaps with the power supply lines 12 and 14 as viewed in plan. Therefore, the resistance of the power supply line 131 can be reduced, and also the vias 122 can be provided over the entire power supply lines 12 and 14.

Second Embodiment

In the second embodiment, power supply lines in the first semiconductor chip 101 are not BPRs but formed in an M1 wiring layer. The planar structure of the semiconductor integrated circuit device according to this embodiment is similar to FIG. 2, but power supply lines formed in the M1 wiring layer, in place of the power supply lines 11 to 14 as BPRs, are provided in the first semiconductor chip 101.

Figure 10:
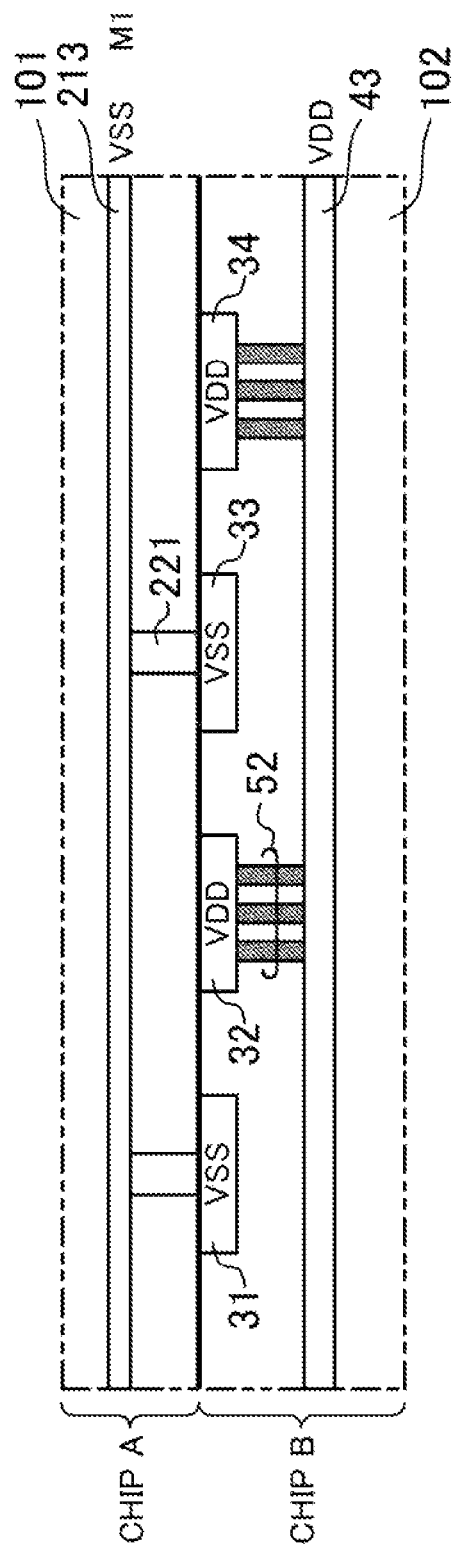
FIG. 10 is a cross-sectional view showing a structure of power supply lines in the second embodiment.

FIG. 10 shows a configuration of the semiconductor integrated circuit device according to this embodiment, which is a cross-sectional view showing a structure of power supply lines in a neighborhood of the interface between the stacked first semiconductor chip 101 and second semiconductor chip 102. FIG. 10 shows a cross-sectional structure taken along line A-A in FIG. 2. As shown in FIG. 10, in the first semiconductor chip 101, a power supply line 213 is formed in the M1 wiring layer, and a plurality of vias 221 are formed from the back surface to reach the power supply line 213.

Figure 11A:
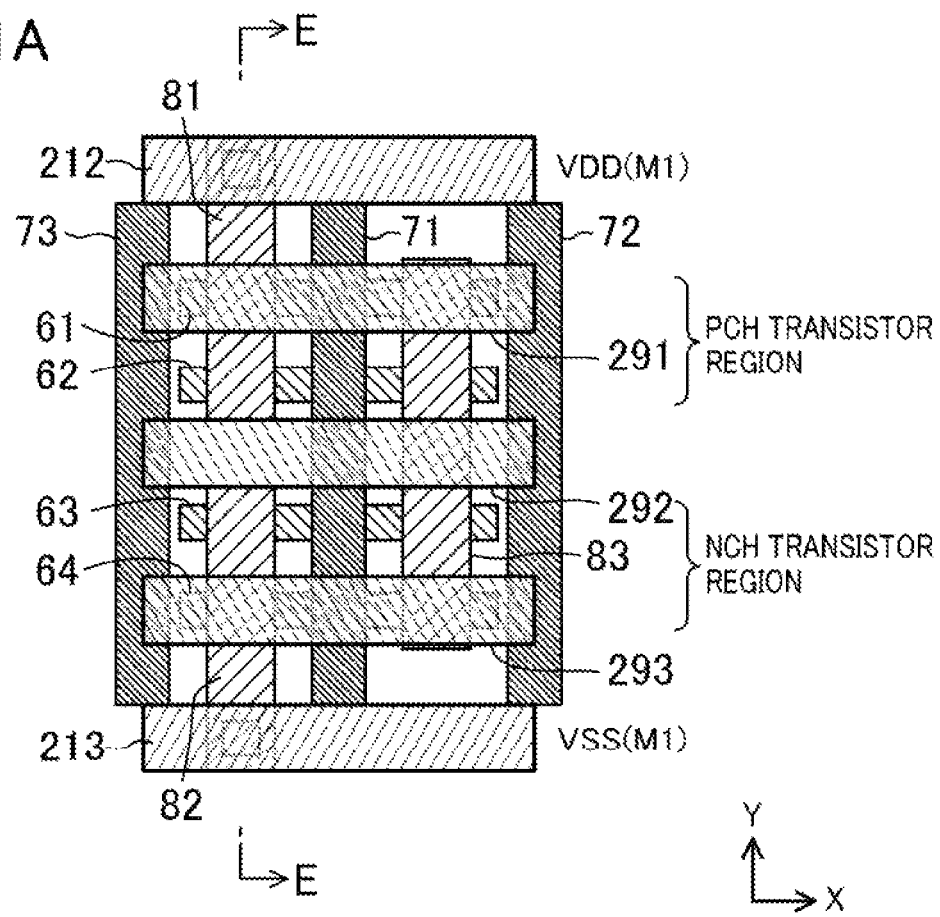
FIGS. 11A and 11B show a configuration example of a standard cell formed in a first semiconductor chip in the second embodiment.
Figure 11B:
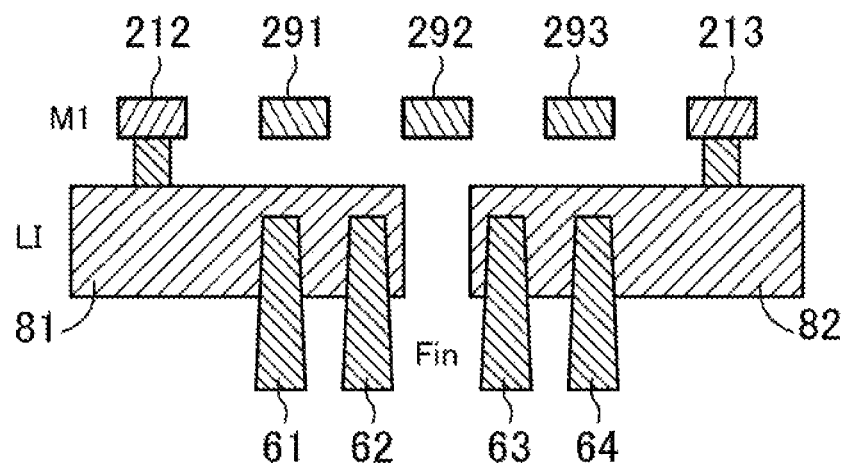

FIGS. 11A and 11B show a configuration example of a standard cell formed in the first semiconductor chip 101, where FIG. 11A is a plan view and FIG. 11B is a cross-sectional view taken along line E-E in FIG. 11A.

The standard cell of FIGS. 11A and 11B is formed between a power supply line 212 for supply of VDD and the power supply line 213 for supply of VSS. The power supply lines 212 and 213 are formed in the M1 wiring layer. Two fins 61 and 62 extending in the X direction are formed in a Pch transistor region, and two fins 63 and 64 extending in the X direction are formed in an Nch transistor region. A gate interconnect 71 is formed to extend in the Y direction, and dummy gate interconnects 72 and 73 are formed on both sides of the gate interconnect 71. A p-type fin transistor is formed by the fins 61 and 62 and the gate interconnect 71, and an n-type fin transistor is formed by the fins 63 and 64 and the gate interconnect 71.

Local interconnects 81, 82, and 83 are formed to extend in the Y direction. The local interconnect 81 connects the power supply line 212 with the fins 61 and 62, the local interconnect 82 connects the power supply line 213 with the fins 63 and 64, and the local interconnect 83 connects the fins 61 and 62 with the fins 63 and 64. Also, signal lines 291, 292, and 293 extending in the X direction are formed in the M1 wiring layer.

Although fin transistors are formed in the example of FIGS. 11A and 11B, the transistors are not limited to this type, but other three-dimensional transistors such as nanowire transistors may be formed.

According to this embodiment, in the first semiconductor chip 101 provided with a plurality of transistors, the power supply line 213, etc. as M1 wiring are connected with the power supply lines 31 to 34 in the second semiconductor chip 102 through a plurality of vias 221. Therefore, by sufficiently providing power supply lines in the second semiconductor chip 102, power can be supplied through low-resistance power supply lines without the need to provide power supply lines other than the M1 wiring in the first semiconductor chip 101.

Also, since the power supply line 213, etc. in the first semiconductor chip 101 and the power supply lines 31 to 34 in the second semiconductor chip 102 extend in directions orthogonal to each other, they can be connected with each other through the vias 221 even if they have different wiring pitches from each other. This makes it possible to fabricate the first and second semiconductor chips 101 and 102 in different processes from each other. Thus, using a mature process or using only a wiring layer process, for example, the semiconductor integrated circuit device 100 can be fabricated at a lower cost.

This embodiment can also be altered as in Alterations 1 and 2 of the first embodiment. By these alterations, effects similar to those in Alterations 1 and 2 of the first embodiment can be obtained.

<Semiconductor Package Structure>

Examples of semiconductor package structures using the semiconductor integrated circuit devices according to the above-described embodiments will be described hereinafter. Note that, while semiconductor package structures of a ball grid array (BGA) type are used in the following description, the type is not limited to this.

Structure Example 1

Figure 12:
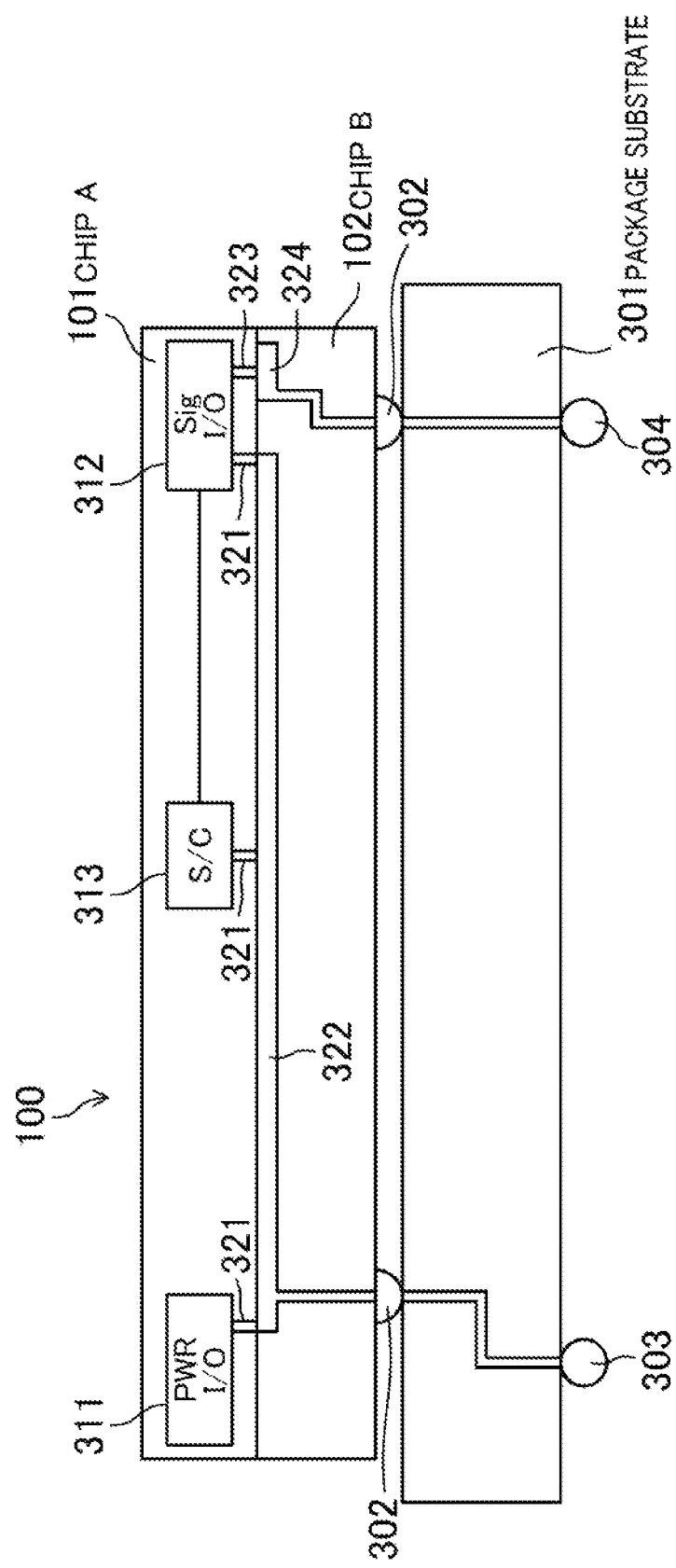
FIG. 12 is a diagrammatic cross-sectional view showing an example of a semiconductor package structure.

FIG. 12 is a diagrammatic cross-sectional view showing a semiconductor package structure of Structure Example 1. In the structure example of FIG. 12, a package substrate 301 has a power supply external terminal 303 and an input/output (IO) signal external terminal 304 on one surface (lower surface in FIG. 12) thereof. The semiconductor integrated circuit device 100 including the first semiconductor chip 101 (chip A) and the second semiconductor chip 102 (chip B) stacked one on top of the other is mounted on the other surface (upper surface in FIG. 12) of the package substrate 301. The second semiconductor chip 102 has bumps 302 formed on the back surface thereof, and is electrically connected with the package substrate 301 through the bumps 302. Although illustration is omitted, a number of bumps and external terminals are actually provided.

The first semiconductor chip 101 has a plurality of cells, which include a power IO cell 311 (abbreviated as PWR I/O in FIG. 12), a signal IO cell 312 (abbreviated as Sig I/O in FIG. 12), and a standard cell (abbreviated as S/C in FIG. 12). The power IO cell 311 includes an electrostatic discharge (ESD) protection circuit for power supply and receives power from the power supply external terminal 303 provided on the package substrate 301. The signal IO cell 312 includes an ESD protection circuit for signals and a circuit used for exchange of input/output signals. The signal IO cell 312 is connected with the power supply external terminal 303 and the IO signal external terminal 304 provided on the package substrate 301. Although a power supply line and a signal line are each shown as a single line for simplification of illustration, the power IO cell 311 may be connected with two or more power supply lines, and the signal IO cell 312 may be connected with two or more power supply lines and two or more signal lines.

The power IO cell 311, the signal IO cell 312, and the standard cell 313 have buried power rails (BPRs) (not shown). The BPRs are connected to a power supply line 322 provided in the second semiconductor chip 102 through vias 321, and further connected to the bump 302 through one or more wiring layers in the second semiconductor chip 102. The bump 302 is connected to the power supply external terminal 303 through lines and vias inside the package substrate 301. That is, the BPRs provided in the power IO cell 311, the signal IO cell 312, and the standard cell 313 are electrically connected to the power supply external terminal 303 provided on the package substrate 301.

The power supply line 322 provided in the second semiconductor chip 102 corresponds to the power supply lines 31, 32, 33, 34 in the first embodiment or to the power supply lines 35, 36, 37, and 38 in Alteration 1, for example.

A signal terminal of the signal IO cell 312 is connected to a signal line 324 provided in the second semiconductor chip 102 through a via 323, and further connected to the bump 302 through one or more wiring layers in the second semiconductor chip 102. The bump 302 is connected to the IO signal external terminal 304 through lines and vias inside the package substrate 301. That is, the signal terminal of the signal IO cell 312 is electrically connected to the IO signal external terminal 304 provided on the package substrate 301.

Having the structure example of FIG. 12, the following effects can be further obtained in addition to the effects in the above-described embodiments.

Since the ESD protection circuit for power supply is provided in the power IO cell 311, no ESD problem will arise even though the power supply line 322 in the second semiconductor chip 102 is directly connected to the standard cell 313. This is because, first, the second semiconductor chip 102 itself, which has only wiring layers, causes no ESD problem. Secondly, although power supply lines are in different nodes in the first semiconductor chip 101 itself, power is distributed from the power supply line 322 in the second semiconductor chip 102 to the standard cell 313 and the power IO cell 311 through the vias 321. Therefore, once the first semiconductor chip 101 is connected with the second semiconductor chip 102, one same node is formed through the power supply line 322, whereby the power supply lines in the first semiconductor chip 101 are inevitably connected with the power IO cell 311.

Also, since the signal terminal of the signal IO cell 312 is connected with the IO signal external terminal 304, it is unnecessary to provide another signal terminal on the top of the first semiconductor chip 101. This simplifies the structure and can reduce the cost. Note that, in this structure example, signal lines must be provided in the second semiconductor chip 102 and the package substrate 301. However, since the signal IO cell 312 is normally provided in a peripheral portion of the first semiconductor chip 101, only a region near the periphery of the second semiconductor chip 102 will be used for laying of the signal lines. Therefore, the influence of this on laying of the power supply lines in the second semiconductor chip 102 is small.

Structure Example 2

Figure 13:
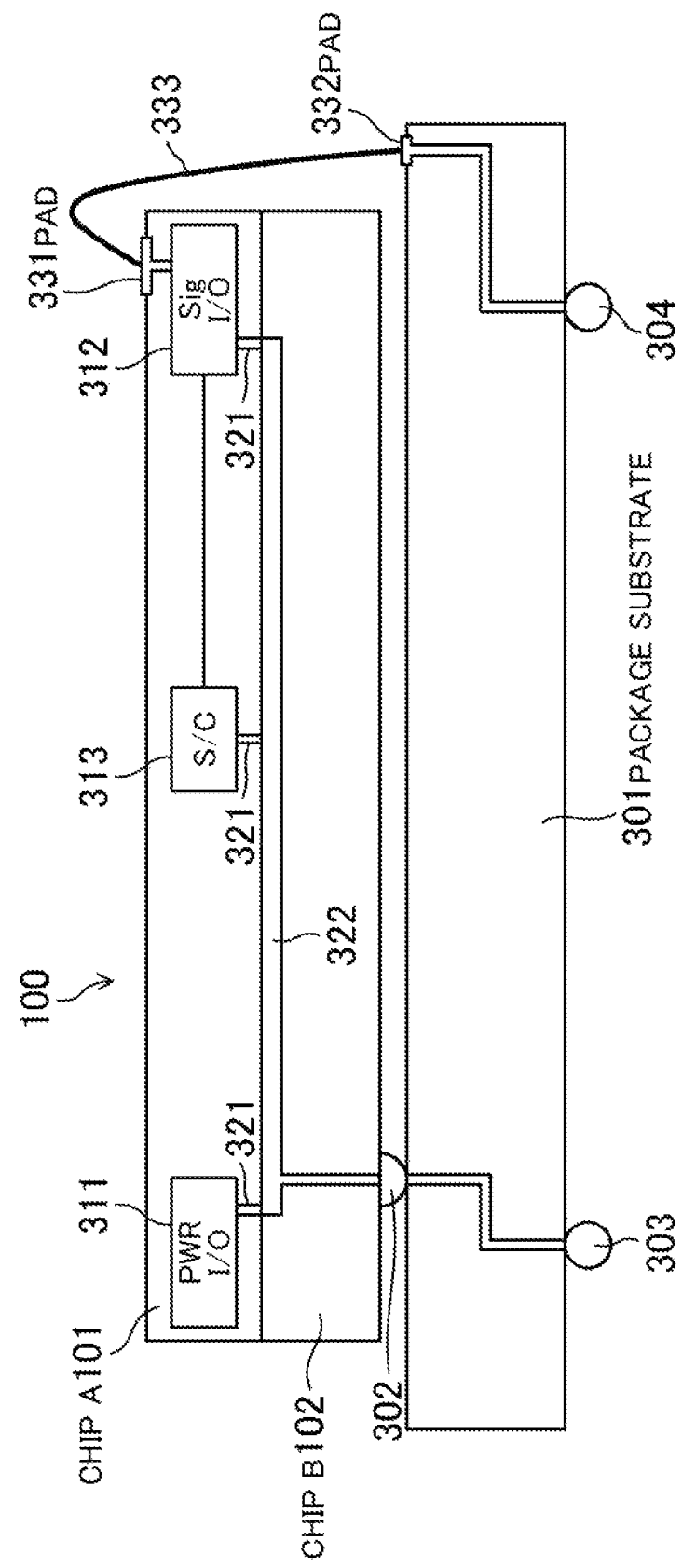
FIG. 13 is a diagrammatic cross-sectional view showing an example of a semiconductor package structure.

FIG. 13 is a diagrammatic cross-sectional view showing a semiconductor package structure of Structure Example 2. The structure example of FIG. 13 is different from that of FIG. 12 in the connection form between the signal IO cell 312 and the IO signal external terminal 304. That is, in the structure example of FIG. 13, the signal terminal of the signal IO cell 312 is connected with a pad 331 provided on the top of the first semiconductor chip 101, and the pad 331 is connected with a pad 332 provided on the package substrate 301 through a bonding wire 333. The pad 332 is connected with the external terminal 304 through lines and vias inside the package substrate 301. The other configuration is similar to the structure example of FIG. 12.

In the structure example of FIG. 13, since it is unnecessary to provide signal lines in the second semiconductor chip 102, the second semiconductor chip 102 can be used only for power supply lines. The resistance of the power supply lines can therefore be reduced.

Structure Example 3

Figure 14:
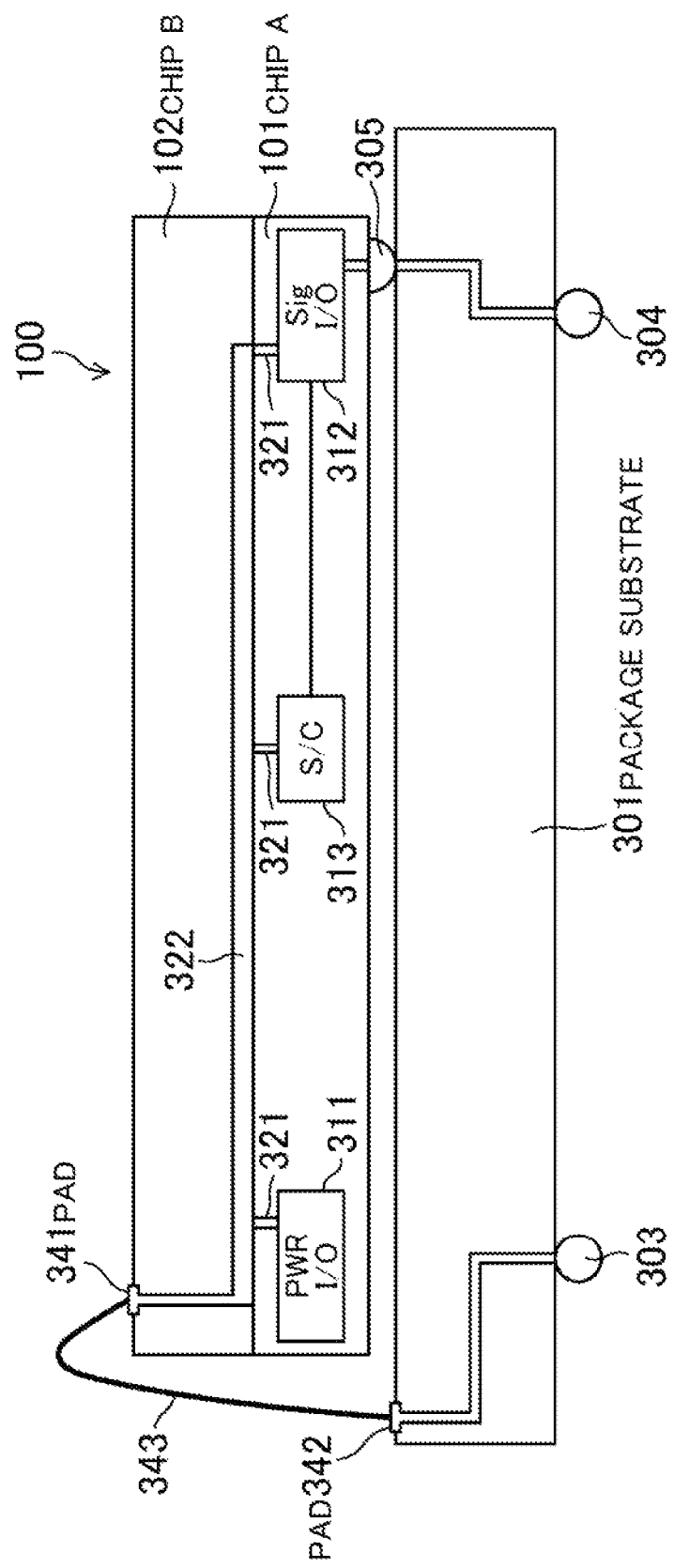
FIG. 14 is a diagrammatic cross-sectional view showing an example of a semiconductor package structure.

FIG. 14 is a diagrammatic cross-sectional view showing a semiconductor package structure of Structure Example 3. In the structure example of FIG. 14, the first semiconductor chip 101 and the second semiconductor chip 102 are vertically inverted to those in the structure examples of FIGS. 12 and 13. The first semiconductor chip 101 has a bump 305 formed on the principal surface thereof, and is electrically connected with the package substrate 301 through the bump 305. The signal terminal of the signal IO cell 312 is connected with the IO signal external terminal 304 through the bump 305.

The second semiconductor chip 102 has a pad 341 on the back surface thereof. The power supply line 322 provided in the second semiconductor chip 102 is connected with the pad 341. The pad 341 is connected with a pad 342 provided on the package substrate 301 through a bonding wire 343. The pad 342 is connected with the external terminal 303 through lines and vias inside the package substrate 301.

In the structure example of FIG. 14, as in the structure example of FIG. 13, since it is unnecessary to provide signal lines in the second semiconductor chip 102, the second semiconductor chip 102 can be used only for power supply lines. The resistance of the power supply lines can therefore be reduced. In addition, since the wiring route of signal lines is short, the resistance and capacitance of the signal lines decrease, so that the operation can be sped up.

Structure Example 4

Figure 15:
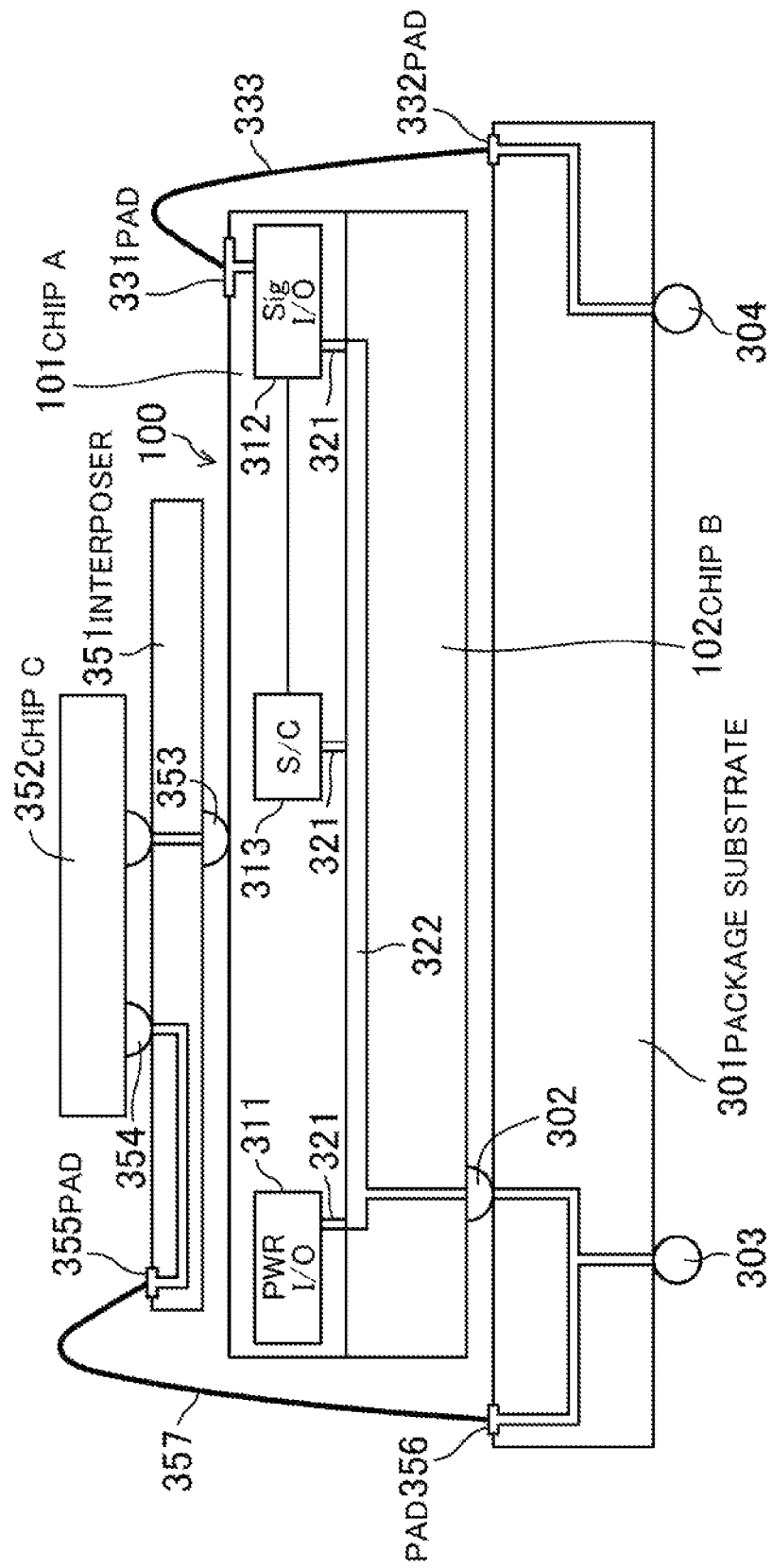
FIG. 15 is a diagrammatic cross-sectional view showing an example of a semiconductor package structure.

FIG. 15 is a diagrammatic cross-sectional view showing a semiconductor package structure of Structure Example 4. The structure example of FIG. 15 has a structure in which an interposer 351 and a third semiconductor chip 352 (chip C) are added to the structure example of FIG. 13. The interposer 351 is a relay substrate having only wiring lines and connected with the first semiconductor chip 101 through a bump 353. The third semiconductor chip 352 is connected with the interposer 351 through bumps 354, and exchanges signals with the first semiconductor chip 101 through the interposer 351.

A pad 355 provided on the interposer 351 is connected with a pad 356 provided on the package substrate 301 through a bonding wire 357. Power for the third semiconductor chip 352 is supplied from the power supply external terminal 303 through lines inside the package substrate 301, the pad 356, the bonding wire 357, the pad 355, a line inside the interposer 351, and the bump 354.

In the structure example of FIG. 15, since it is unnecessary to provide signal lines in the second semiconductor chip 102, the second semiconductor chip 102 can be used only for power supply lines. The resistance of the power supply lines can therefore be reduced.

In the semiconductor package structures described above, the power IO cell 311, the signal IO cell 312, and the standard cell 313 are assumed to have buried power rails. The configuration is not limited to this, but these cells may have power supply lines formed in a wiring layer such as the M1 wiring layer.

According to the present disclosure, in a semiconductor integrated circuit device including semiconductor chips stacked one on top of the other, a new structure of power supply lines for more effective power supply can be provided. The present disclosure is therefore effective for improvement in the performance of LSI and for downsizing of LSI.

What is claimed is:

1. A semiconductor integrated circuit device, comprising:
    a first semiconductor chip; and
    a second semiconductor chip, the first and second semiconductor chips being stacked one on top of the other,
    wherein
    a back surface of the first semiconductor chip and a principal surface of the second semiconductor chip face each other,
    the first semiconductor chip includes
        a plurality of transistors,
        a plurality of first power supply lines extending in a first direction, arranged in a second direction perpendicular to the first direction, for supplying a first power supply voltage to the plurality of transistors, and
        a plurality of first vias formed from the back surface of the first semiconductor chip to reach the first power supply lines,
    the second semiconductor chip includes
        a plurality of second power supply lines formed in a first wiring layer that is a wiring layer closest to the principal surface of the second semiconductor chip, the second power supply lines extending in the second direction and arranged in the first direction, and
    the first power supply lines are connected with the second power supply lines through the plurality of first vias.

2. The semiconductor integrated circuit device of claim 1, wherein the first semiconductor chip includes
- a plurality of third power supply lines extending in the first direction, arranged in the second direction, for supplying a second power supply voltage to the plurality of transistors, and
- a plurality of second vias formed from the back surface of the first semiconductor chip to reach the third power supply lines, the second semiconductor chip includes
- a plurality of fourth power supply lines formed in the first wiring layer, extending in the second direction and arranged in the first direction, and the third power supply lines are connected with the fourth power supply lines through the plurality of second vias.

3. A semiconductor package structure, comprising:
- a package substrate having a power supply external terminal provided on one surface; and
- the semiconductor integrated circuit device of claim 1 mounted on the other surface of the package substrate, and
- the second power supply lines in the second semiconductor chip of the semiconductor integrated circuit device are electrically connected to the external terminal.

4. The semiconductor package structure of claim 3, wherein
- the second semiconductor chip has a bump on its back surface and is connected with the package substrate through the bump, and
- the second power supply lines are electrically connected to the external terminal through the bump.

5. The semiconductor package structure of claim 3, wherein
- the first semiconductor chip has a bump on its principal surface and is connected with the package substrate through the bump, and
- the second power supply lines are electrically connected to the external terminal through a bonding wire.

* * * * *